United States Patent
Quek et al.

(12)

(10) Patent No.: US 6,261,917 B1
(45) Date of Patent: Jul. 17, 2001

(54) HIGH-K MOM CAPACITOR

(75) Inventors: Shyue Fong Quek, Petaling Jaya (MY); Ting Cheong Ang; Sang Yee Loong, both of Singapore (SG); Puay Ing Ong, Johor (MY)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/567,420

(22) Filed: May 9, 2000

(51) Int. Cl.[7] ................................................... H01L 21/20
(52) U.S. Cl. ............................ 438/396; 438/317; 438/624
(58) Field of Search .................................. 438/396, 314, 438/317, 624, 635, 386, 253, 788, 910

(56) References Cited

U.S. PATENT DOCUMENTS

| | | | |
|---|---|---|---|
| 4,481,283 | * 11/1984 | Kerr et al. | 438/396 |
| 5,275,715 | 1/1994 | Tuttle | 205/123 |
| 5,350,705 | 9/1994 | Brassington et al. | 257/295 |
| 5,622,607 | * 4/1997 | Yamazaki et al. | 438/788 |
| 5,716,875 | 2/1998 | Jones, Jr. et al. | 438/3 |
| 5,948,216 | 9/1999 | Cava et al. | 204/192.22 |
| 5,953,609 | 9/1999 | Koyama et al. | 438/253 |
| 6,100,155 | * 8/2000 | Hu | 438/386 |

* cited by examiner

*Primary Examiner*—Matthew Smith
*Assistant Examiner*—Igwe U. Anya
(74) *Attorney, Agent, or Firm*—George O. Saile; Rosemary L. S. Pike

(57) ABSTRACT

A method for fabricating a metal-oxide-metal capacitor is described. A first insulating layer is provided overlying a semiconductor substrate. A barrier metal layer and a first metal layer are deposited over the insulating layer. A titanium layer is deposited overlying the first metal layer. The titanium layer is exposed to an oxidizing plasma while simultaneously a portion of the titanium layer where the metal-oxide-metal capacitor is to be formed is exposed to light whereby the portion of the titanium layer exposed to light reacts with the oxidizing plasma to form titanium oxide. Thereafter, the titanium layer is removed, leaving the titanium oxide layer where the metal-oxide-metal capacitor is to be formed. A second metal layer is deposited overlying the first metal layer and the titanium oxide layer. The second metal layer, titanium oxide layer, and first metal layer are patterned to form a metal-oxide-metal capacitor wherein the second metal layer forms an upper plate electrode, the titanium oxide layer forms a capacitor dielectric, and the first metal layer forms a bottom plate electrode of the MOM capacitor.

30 Claims, 4 Drawing Sheets

HIGH-K MOM CAPACITOR

BACKGROUND OF THE INVENTION

(1) Field of the Invention

The present invention relates to a method of fabricating a metal-oxide-metal capacitor, and more particularly, to a method of forming an improved metal-oxide metal capacitor having high dielectric constant in the fabrication of an integrated circuit device.

(2) Description of the Prior Art

Capacitors are critical components in the integrated circuit devices of today. As devices become smaller and circuit density increases, it is critical that capacitors maintain their level of capacitance while taking up a smaller floor area on the circuit. A high dielectric constant for the capacitor will allow a smaller floor area capacitor to have the same capacitance and will also result in the desirable lowering of tunneling current density. Reducing circuit floor plan can improve circuit density.

U.S. Pat. No. 5,275,715 to Tuttle s hows a $TiO_x$ etch stop layer formed by reaction with $O_2$ or $O_3$. U.S. Pat. No. 5,716,875 to Jones, Jr. et al shows a capacitor having a $TiO_2$/Pt layer. U.S. Pat. No. 4,481,288 to Kerr et al discloses a MOM capacitor having an $AlO_x$ Layer. U.S. Pat. No. 5,953,609 to Koyama et al shows a polysilicon capacitor having a $TiO_x$ layer. U.S. Pat. No. 5,350,705 to Brassington et al discloses a $TiO_x$ layer under the bottom plate of a MOM capacitor and a ruthenium oxide capacitor dielectric. U.S. Pat. No. 5,948,216 to Cava et al teaches a MOM capacitor having a $Ta_2O_5/TiO_2$ dielectric layer. Many of these methods involve high temperature operations to form the dielectric layers. It is desired to provide a room temperature method of forming the capacitor dielectric layer.

SUMMARY OF THE INVENTION

Accordingly, it is a primary object of the invention to provide an effective and very manufacturable process for producing a metal-oxide-metal capacitor.

Another object of the present invention is to provide a method for fabricating a metal-oxide-metal capacitor having a high dielectric constant.

Yet another object of the present invention is to provide a room temperature method for fabricating a metal-oxide-metal capacitor having a high dielectric constant.

A further object of the present invention is to provide a method for fabricating a metal-oxide-metal capacitor having a titanium oxide capacitor dielectric.

In accordance with the objects of this invention, a method for fabricating a metal-oxide-metal capacitor is achieved. A first insulating layer is provided overlying a semiconductor substrate. A barrier metal layer and a first metal layer are deposited over the insulating layer. A titanium layer is deposited overlying the first metal layer. The titanium layer is exposed to an oxidizing plasma while simultaneously a portion of the titanium layer where the metal-oxide-metal capacitor is to be formed is exposed to light whereby the portion of the titanium layer exposed to light reacts with the oxidizing plasma to form titanium oxide. Thereafter, the titanium layer is removed, leaving the titanium oxide layer where the metal-oxide-metal capacitor is to be formed. A second metal layer is deposited overlying the first metal layer and the titanium oxide layer. The second metal layer, titanium oxide layer, and first metal layer are patterned to form a metal-oxide-metal capacitor wherein the second metal layer forms an upper plate electrode, the titanium oxide layer forms a capacitor dielectric, and the first metal layer forms a bottom plate electrode of the MOM capacitor.

BRIEF DESCRIPTION OF THE DRAWINGS

In the following drawings forming a material part of this description, there is shown.

DESCRIPTION OF THE PREFERRED EMBODIMENTS

Figure 1:
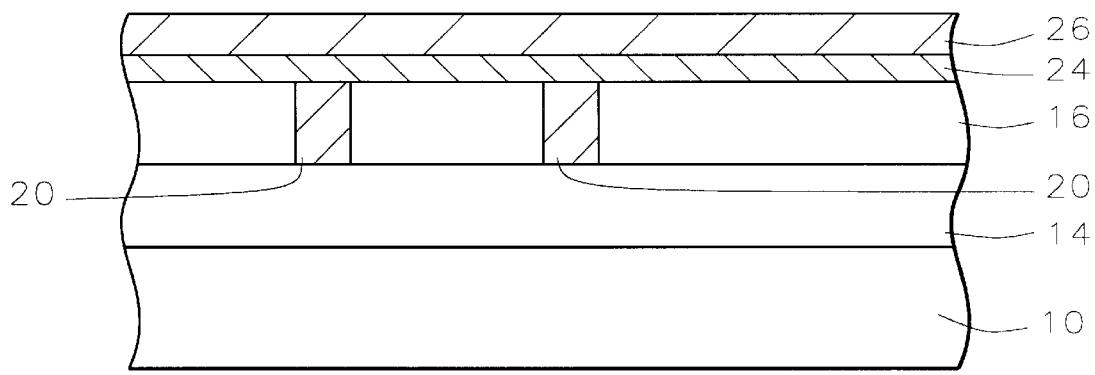
FIGS. 1 through 8 are schematic cross-sectional representations of a preferred embodiment of the present invention.

Referring now more particularly to FIG. 1, there is shown a partially completed integrated circuit device. The semiconductor substrate 10 is preferably composed of silicon having a (100) crystallographic orientation. Semiconductor device structures are formed in and on the semiconductor substrate. These may include gate electrodes and interconnection lines and associated source and drain regions. The semiconductor device structures, not shown, may be formed in layer 14 and covered with an insulating layer 16.

Connections are made to the underlying semiconductor device structures. For example, vias or contacts 20 may be formed through the insulating layer 16 to contact devices within layer 14, not shown. Vias or contacts may comprises tungsten plugs, for example, or copper plugs.

Now, a barrier metal layer 24 is deposited over the insulating layer 16. This barrier metal layer may comprise tantalum nitride and have a thickness of between about 50 and 200 Angstroms. Now, a metal layer is formed over the barrier metal layer, such as by sputtering or electroplating. The metal layer 26 may comprise aluminum, copper, aluminum or copper alloy such as AlCu, or the like. The metal layer 26 has a thickness of between about 2000 and 6000 Angstroms. The metal layer 26 will form the bottom plate electrode of the capacitor.

Figure 2:
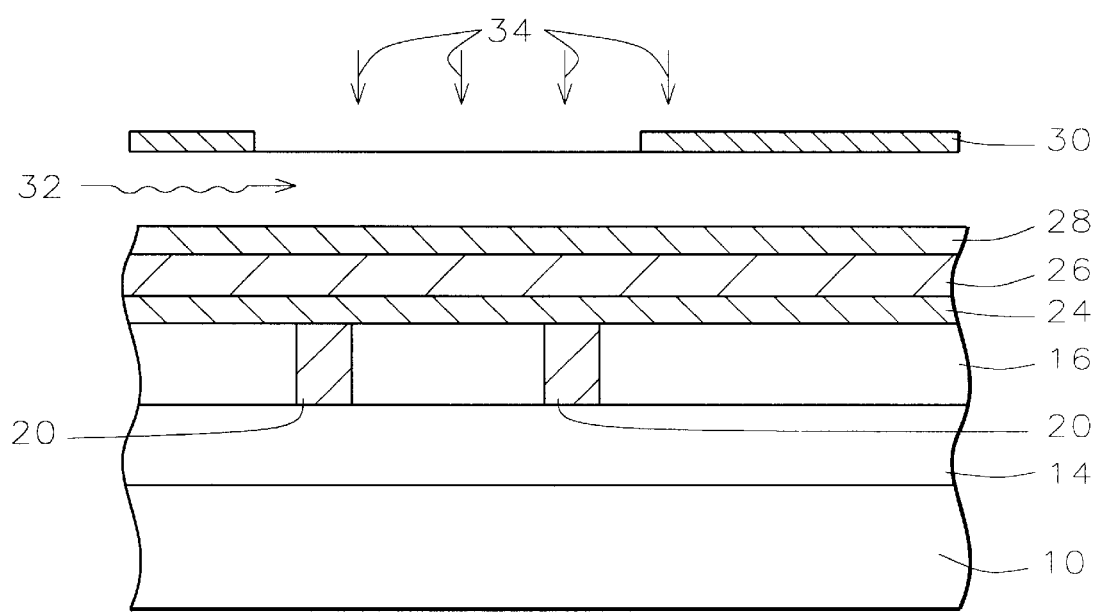

Referring now to FIG. 2, the novel capacitor dielectric layer of the present invention will be formed. A titanium layer 28 is deposited over the metal layer 26 to a thickness of between about 50 and 200 Angstroms. Alternatively, aluminum or tantalum could be used for this layer.

Figure 3:
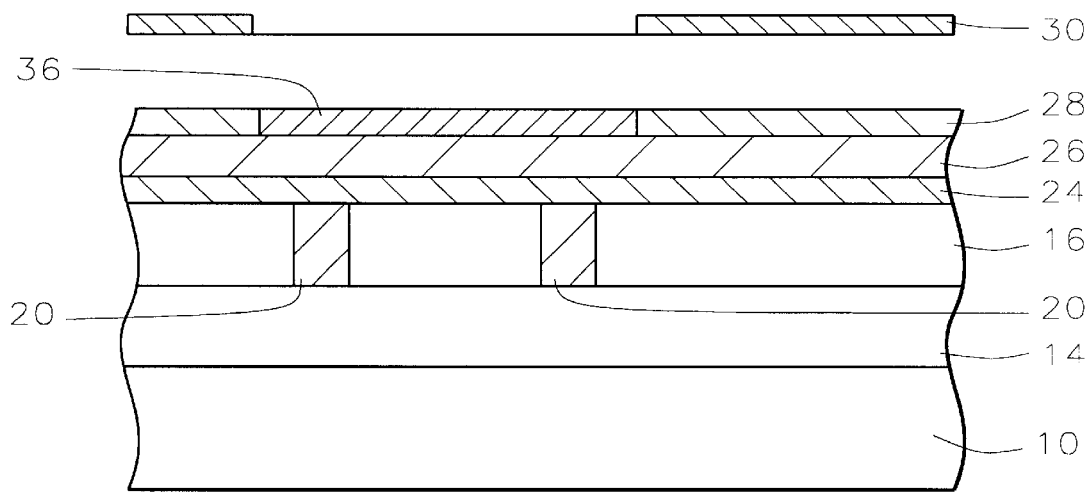

The MOM capacitor reticle 30 is placed over the wafer having an opening where the MOM capacitor is to be formed. This may be a reverse of the capacitor reticle. An oxidizing gas, comprising $O_2$ or $O_3$, mixed with an inert gas is introduced 32. Simultaneously, the wafer is exposed to i-line or ultra-violet light 34 through the opening in the reticle 30. Where the titanium layer 28 is exposed to the light 34 through the opening in the reticle, the titanium reacts with the oxygen or ozone gas 32 to form titanium dioxide 36, as shown in FIG. 3.

The oxygen or ozone gas is flowed at the rate of 100 to 1000 sccm while the inert gas is flowed at 1 to 5 slm. I-line or UV light exposure is at 1 to 1000 millijoules. This can be a room temperature process. The high temperatures of the prior art are not necessary. This fact simplifies the process and preserves the integrity of the underlying thin film or active devices. The film thickness is self-limiting by means of gas flow and light source energy. i-line wavelengths break down $O_3$ and deep UV breaks down $O_2$ to become $O_3$ radicals.

Figure 4:
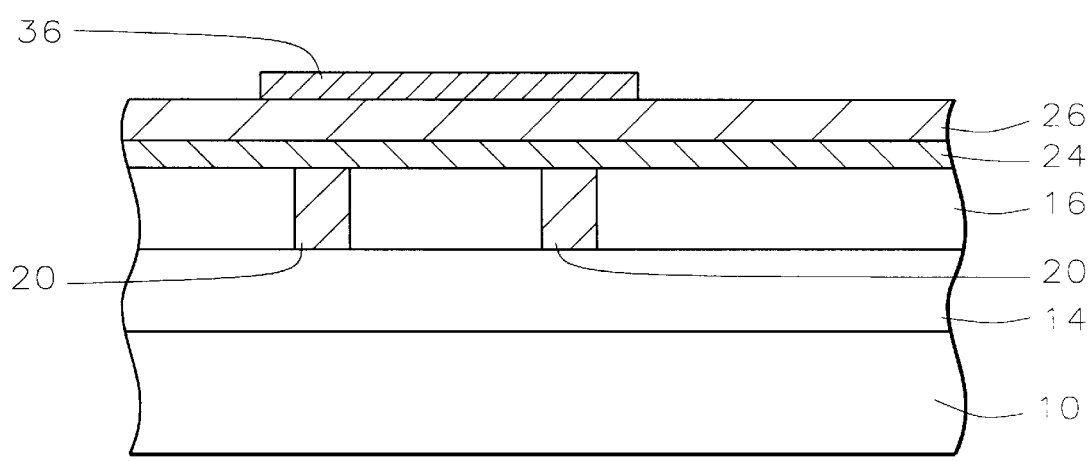

The unreacted titanium 28 is removed by a dry etching process using chlorine type gases, for example, leaving the titanium oxide capacitor dielectric 36 only in the area of the planned capacitor, as shown in FIG. 4. Since the capacitor dielectric is formed only in the area where the capacitor is to be formed, an additional mask is not necessary. The capacitor dielectric layer will comprise titanium oxide, as described, or aluminum oxide or tantalum oxide if aluminum or tantalum are deposited as the layer 28.

Figure 5:
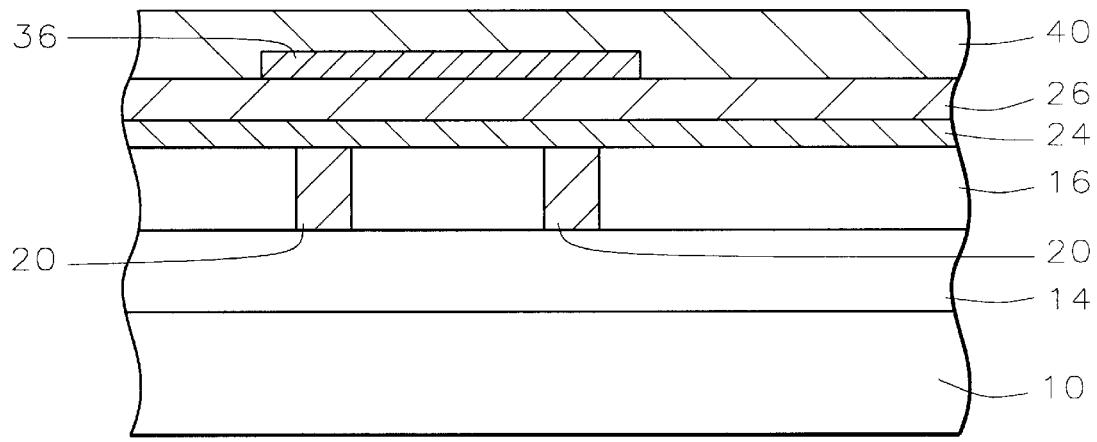

Referring now to FIG. 5, a second metal layer 40 is deposited over the capacitor dielectric 36 and the first metal layer 26 to a thickness of between about 1000 and 8000 Angstroms. This metal layer also may be aluminum, AlCu, or copper, or the like.

Figure 6:
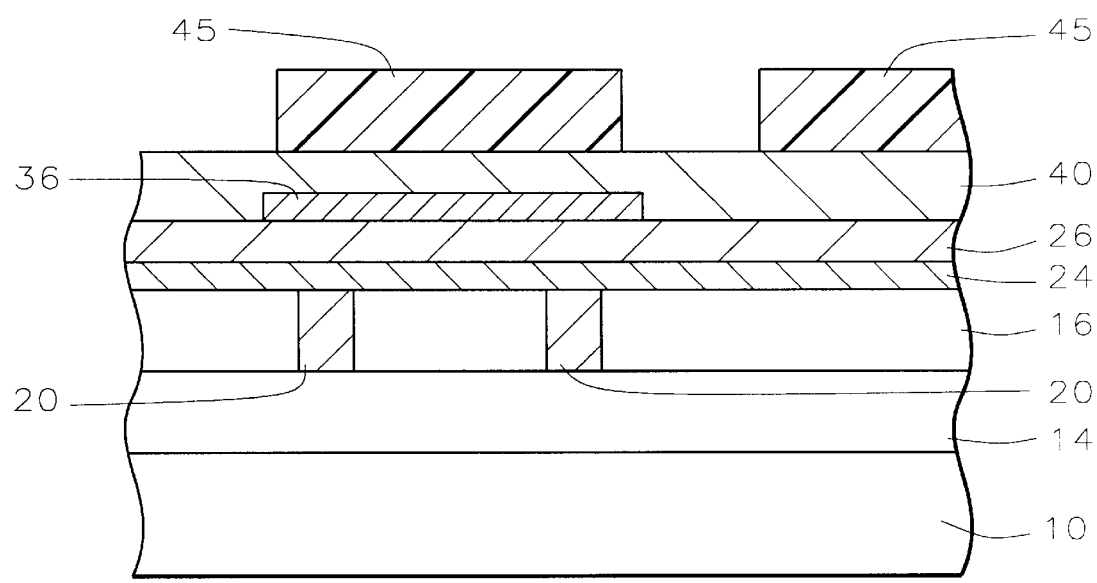

A photoresist layer is coated over the wafer. The same capacitor reticle is again placed over the wafer, not shown. The photoresist layer is exposed to actinic light through openings in the capacitor reticle and developed to form a photoresist mask 45. The mask covers the area of the planned capacitor, as shown in FIG. 6.

Figure 7:
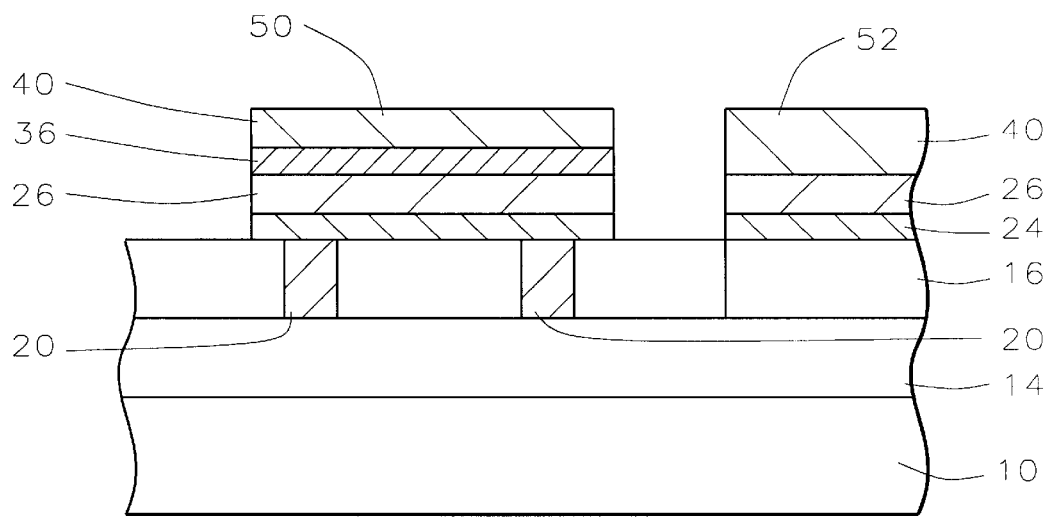

The metal layers 40 and 26, capacitor dielectric 36, and barrier metal layer 24 are etched away where they are not covered by the mask 45 to form a MOM capacitor 50 and metal line 52, as shown in FIG. 7. The MOM capacitor comprises top plate electrode 40, capacitor dielectric 36, bottom plate electrode 26, and node contacts 20. The metal line 52 is a metal interconnect. Etching all of these three layers at once requires a more complex etching process. However, the advantage of this arrangement is that the MOM capacitor and interconnect will not create topological complication toward the metallization.

FIGS. 1 through 7 illustrate the method of a preferred embodiment of the present invention. It should be understood that the MOM capacitor of the present invention may be formed at any level within the wafer.

Figure 8:
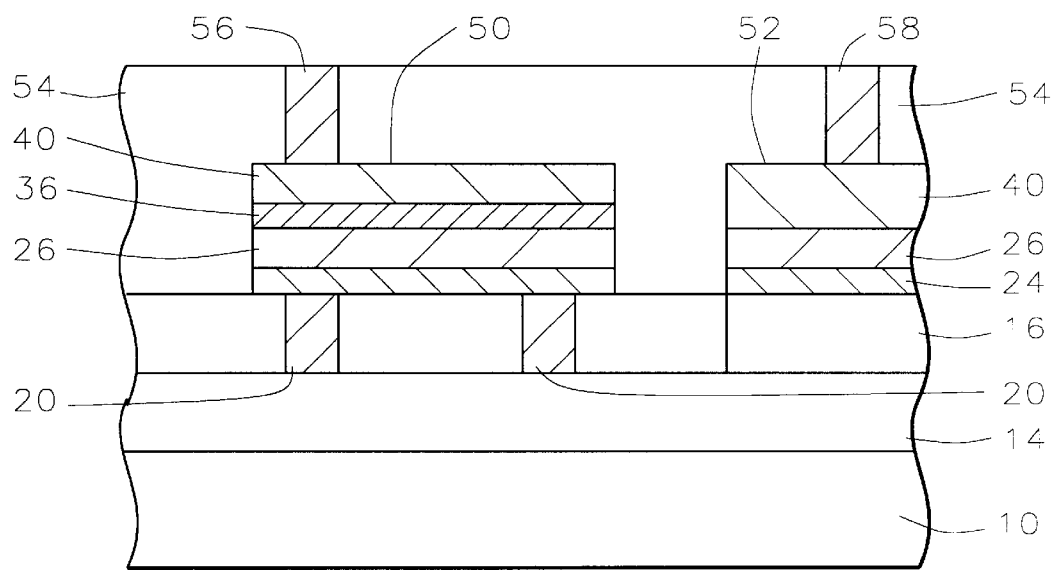

Processing continues as conventional in the art. For example, as shown in FIG. 8, a thick insulating layer 54 is blanket deposited over the capacitor and metal line. Connections are made through openings in the thick insulating layer to the capacitor and metal line, for example, via metal plugs 56 and 58, respectively.

The process of the invention results in the fabrication of a metal-oxide-metal capacitor having a high dielectric constant capacitor dielectric layer. The capacitor dielectric layer of the present invention is formed in a room temperature process. The thickness of the layer can be self-limiting by means of the gas flow and light source. Another advantage of the process of the invention is minimal topological complication because the MOM capacitor will be almost the same height as the metal interconnect.

While the invention has been particularly shown and described with reference to the preferred embodiments thereof, it will be understood by those skilled in the art that various changes in form and details may be made without departing from the spirit and scope of the invention.

What is claimed is:

1. A method for fabricating a metal-oxide-metal capacitor comprising:
   providing a first insulating layer overlying a semiconductor substrate;
   depositing a first metal layer over said insulating layer;
   depositing a second metal layer overlying said first metal layer;
   exposing said second metal layer to an oxidizing plasma while simultaneously exposing a portion of said second metal layer where said metal-oxide-metal capacitor is to be formed to light whereby said portion of said second metal layer exposed to said light reacts with said oxidizing plasma to form a metal oxide;
   thereafter removing said second metal layer leaving said metal oxide layer where said metal-oxide-metal capacitor is to be formed;
   depositing a third metal layer overlying said first metal layer and said metal oxide layer; and
   patterning said third metal layer, said metal oxide layer, and said first metal layer to form said metal-oxide-metal capacitor wherein said third metal layer forms an upper plate electrode, said metal oxide layer forms a capacitor dielectric, and said first metal layer forms a bottom plate electrode of said capacitor completing said fabrication of said metal-oxide-metal capacitor.

2. The method according to claim 1 wherein said semiconductor substrate includes semiconductor device structures such as gate electrodes and source and drain regions.

3. The method according to claim 2 further comprising forming contacts between some of said semiconductor device structures and said first metal layer to form a node contact of said metal-oxide-metal capacitor.

4. The method according to claim 1 wherein said semiconductor substrate includes semiconductor device structures such as gate electrodes and source and drain regions and multiple levels of metal interconnections.

5. The method according to claim 1 wherein said first metal layer comprises one of the group containing aluminum, aluminum alloys, copper, and copper alloys.

6. The method according to claim 1 further comprising depositing a barrier metal layer underlying said first metal layer wherein said barrier metal layer has a thickness of between about 50 and 200 Angstroms.

7. The method according to claim 1 wherein said second metal layer comprises one of the group containing titanium, aluminum, and tantalum and wherein said second metal layer has a thickness of between about 50 and 200 Angstroms.

8. The method according to claim 1 wherein said oxidizing plasma comprises one of the group containing $O_2$ and $O_3$.

9. The method according to claim 1 wherein said light comprises one of the group containing i-line light and ultra-violet light.

10. The method according to claim 1 wherein said steps of depositing and exposing said second metal layer are performed at room temperature.

11. The method according to claim 1 wherein said third metal layer comprises one of the group containing aluminum, aluminum alloys, copper, and copper alloys.

12. A method for fabricating a metal-oxide-metal capacitor comprising:
   providing a first insulating layer overlying semiconductor device structures in and on a semiconductor substrate;
   forming a contact through said first insulating layer to at least one of said semiconductor device structures wherein said contact will form a node contact for planned said metal-oxide-metal capacitor;
   depositing a barrier metal layer overlying said first insulating layer and said contact;
   depositing a first metal layer over said barrier metal layer;
   depositing a titanium layer overlying said first metal layer;
   exposing said titanium layer to an oxidizing plasma while simultaneously exposing to light a portion of said titanium layer where said metal-oxide-metal capacitor is to be formed overlying said contact whereby said portion of said titanium layer exposed to said light reacts with said oxidizing plasma to form titanium oxide;

thereafter removing said titanium layer leaving said titanium oxide layer where said metal-oxide-metal capacitor is to be formed;

depositing a second metal layer overlying said first metal layer and said titanium oxide layer; and patterning said second metal layer, said titanium oxide layer, and said first metal layer to form said metal-oxide-metal capacitor wherein said second metal layer forms an upper plate electrode, said titanium oxide layer forms a capacitor dielectric, and said first metal layer forms a bottom plate electrode of said capacitor completing said fabrication of said metal-oxide-metal capacitor.

13. The method according to claim 12 wherein said semiconductor device structures include gate electrodes and source and drain regions.

14. The method according to claim 12 wherein said semiconductor device structures include gate electrodes and source and drain regions and multiple levels of metal interconnections.

15. The method according to claim 12 wherein said first metal layer comprises one of the group containing aluminum, aluminum alloys, copper, and copper alloys.

16. The method according to claim 12 wherein said barrier metal layer has a thickness of between about 50 and 200 Angstroms.

17. The method according to claim 12 wherein said titanium layer has a thickness of between about 50 and 200 Angstroms.

18. The method according to claim 12 wherein said oxidizing plasma comprises one of the group containing $O_2$ and $O_3$.

19. The method according to claim 12 wherein said light comprises one of the group containing i-line light and ultra-violet light.

20. The method according to claim 12 wherein said steps of depositing and exposing said titanium layer are performed at room temperature.

21. The method according to claim 12 wherein said second metal layer comprises one of the group containing aluminum, aluminum alloys, copper, and copper alloys.

22. A method for fabricating a metal-oxide-metal capacitor comprising:

providing a first insulating layer overlying semiconductor device structures in and on a semiconductor substrate;

forming a contact through said first insulating layer to at least one of said semiconductor device structures wherein said contact will form a node contact for planned said metal-oxide-metal capacitor;

depositing a barrier metal layer overlying said first insulating layer and said contact;

depositing a first metal layer over said barrier metal layer;

depositing a second metal layer overlying said first metal layer;

exposing said second metal layer to an oxidizing plasma comprising one of the group containing $O_2$ and $O_3$ while simultaneously exposing to light a portion of said second metal layer where said metal-oxide-metal capacitor is to be formed overlying said contact whereby said portion of said second metal layer exposed to said light reacts with said oxidizing plasma to form a metal oxide;

thereafter removing said second metal layer leaving said metal oxide layer where said metal-oxide-metal capacitor is to be formed;

depositing a third metal layer overlying said first metal layer and said metal oxide layer; and patterning said third metal layer, said metal oxide layer, and said first metal layer to form said metal-oxide-metal capacitor wherein said third metal layer forms an upper plate electrode, said metal oxide layer forms a capacitor dielectric, and s aid first metal Layer forms a bottom plate electrode of said capacitor completing said fabrication of said metal-oxide-metal capacitor.

23. The method according to claim 22 wherein said semiconductor device structures include gate electrodes and source and drain regions.

24. The method according to claim 22 wherein said semiconductor device structures include gate electrodes and source and drain regions and multiple levels of metal interconnections.

25. The method according to claim 22 wherein said first metal layer comprises one of the group containing aluminum, aluminum alloys, copper, and copper alloys.

26. The method according to claim 22 wherein said barrier metal layer has a thickness of between about 50 and 200 Angstroms.

27. The method according to claim 22 wherein said second metal layer comprises one of the group containing titanium, aluminum, and tantalum, and wherein said second metal layer has a thickness of between about 50 and 200 Angstroms.

28. The method according to claim 22 wherein said light comprises one of the group containing i-line light and ultra-violet light.

29. The method according to claim 22 wherein said steps of depositing and exposing said second metal layer are performed at room temperature.

30. The method according to claim 22 wherein said third metal layer comprises one of the group containing aluminum, aluminum alloys, copper, and copper alloys.

* * * * *